(12) United States Patent
Weng et al.

(10) Patent No.: US 7,595,541 B2
(45) Date of Patent: Sep. 29, 2009

(54) PHOTO DETECTOR AND METHOD FOR FORMING THEREOF

(75) Inventors: Chien-Sen Weng, Hsin-Chu (TW);
Yi-Wei Chen, Hsin-Chu (TW);
Chih-Wei Chao, Hsin-Chu (TW);
Kun-Chih Lin, Hsin-Chu (TW)

(73) Assignee: AU Optrinics Corp., Hsin-Chu (TW)

( * ) Notice: Subject to any disclaimer, the term of this patent is extended or adjusted under 35 U.S.C. 154(b) by 84 days.

(21) Appl. No.: 11/776,559

(22) Filed: Jul. 12, 2007

(65) Prior Publication Data
US 2008/0284341 A1 Nov. 20, 2008

(30) Foreign Application Priority Data
May 14, 2007 (TW) .............................. 96117104 A

(51) Int. Cl.
*H01L 31/075* (2006.01)
(52) U.S. Cl. ................................. 257/458; 257/E31.11
(58) Field of Classification Search ................ 257/458, 257/431, 434, 466
See application file for complete search history.

(56) References Cited

U.S. PATENT DOCUMENTS

| | | | |
|---|---|---|---|
| 2005/0136566 A1* | 6/2005 | Morse | 438/63 |
| 2006/0216937 A1* | 9/2006 | Dunton et al. | 438/692 |
| 2008/0284341 A1* | 11/2008 | Weng et al. | 315/152 |

* cited by examiner

*Primary Examiner*—Kiesha L Rose
*Assistant Examiner*—Mark W Tornow
(74) *Attorney, Agent, or Firm*—Winston Hsu

(57) ABSTRACT

A photo detector is disclosed. The photo detector has a substrate, a semiconductor layer disposed on the substrate, an insulating layer covered on the semiconductor layer, an interlayer dielectric layer covered on the insulating layer, and two electrodes formed on a portion of the interlayer dielectric layer. The semiconductor layer has a first doping region, a second doping region, and an intrinsic region located between the first doping region and the second doping region. The interlayer dielectric layer has at least three holes to expose a portion of the insulating layer, a portion of the first doping region, and the second doping region. The electrodes are connected to the first doping region and the second doping region through two of the holes.

32 Claims, 13 Drawing Sheets

PHOTO DETECTOR AND METHOD FOR FORMING THEREOF

BACKGROUND OF THE INVENTION

1. Field of the Invention

The present invention relates to a photo detector.

2. Description of the Prior Art

Flat panel displays are widely employed in various consumer products such as liquid crystal displays, liquid crystal televisions, plasma televisions, cellular phones, personal digital assistants, digital cameras, display panel of portable game machines, and touch panel of automatic transaction machines. Hence, how to increase the color and brightness of the flat panel display has become an important task. Most of today's displays include photo detectors for detecting ambient lights. By having color and brightness of the display would adjust according to ambient lights, consumers would perceive a much better visual experience.

Referring to FIG. 1, FIG. 1 illustrates a structural view of a photo detector composed of PIN diode according to the prior art. As shown in FIG. 1, a substrate 12 is first provided, and a semiconductor layer 14 composed of polysilicon is formed on the substrate 12. The semiconductor layer 14 preferably has a first doping region 16, a second doping region 18, and an intrinsic region 20 positioned between the first doping region 16 and the second doping region 18. Specifically, the first doping region 16 is doped with p-type dopants and the second doping region 18 is doped with n-type dopants.

An insulating layer 22 is then deposited on the semiconductor layer 14, and an interlayer dielectric 24 is disposed on the insulating layer 22 thereafter. Typically, the insulating layer 22 is composed of silicon nitride having a thickness of about 100 angstroms and the interlayer dielectric 24 is composed of silicon oxide having a thickness of about 3,000 angstroms.

An etching process is then conducted to form two holes 26 within the interlayer dielectric 24 and the insulating layer 22, in which the holes 26 expose a portion of the first doping region 16 and a portion of the second doping region 18. Two electrodes 28 are then formed on the interlayer dielectric 24 and are connected to the first doping region 16 and the second doping region 18 through the holes 26, thus complete the fabrication of a PIN photo detector.

Typically, the intrinsic region of a PIN diode is a high resistance region which un-doped with any movable carriers, and the fabrication of the PIN diode can be achieved along with a standard TFT-LCD fabrication process. However, it should be noted that after the formation of the gate pattern, the gate is used as a mask for conducting a doping process by injecting dopants into the semiconductor layer 14 to form doped region, such as lightly drains or highly drains. While this step is conducted, the region above the intrinsic region is unprotected and n-type dopants such as phosphorus used in the doping process would be injected into the intrinsic region. The result of injecting n-type dopants into the intrinsic region not only reduces the sensitivity of the photo detector but also affects the performance of the device.

SUMMARY OF THE INVENTION

It is an objective of the present invention to provide a photo detector and method for fabricating the same.

A photo detector is disclosed. The photo detector has a substrate, a semiconductor layer disposed on the substrate, an insulating layer covered on the semiconductor layer, an interlayer dielectric layer covered on the insulating layer, and two electrodes formed on a portion of the interlayer dielectric layer. The semiconductor layer has a first doping region, a second doping region, and an intrinsic region located between the first doping region and the second doping region. The interlayer dielectric layer has at least three holes is adapted to expose a portion of the insulating layer, a portion of the first doping region, and a portion of the second doping region. The two electrodes are electrically connected to the first doping region and the second doping region through two of the holes.

A method for fabricating a photo detector is disclosed. The method comprising: providing a substrate; forming a semiconductor layer having a first doping region, a second doping region, and an intrinsic region located between the first doping region on the substrate; covering an insulating layer on the semiconductor layer; covering an interlayer dielectric layer on the insulating layer, wherein the interlayer dielectric layer comprises at least three holes is adapted to expose a portion of the insulating layer, a portion of the first doping region, and a portion of the second doping region; and forming two electrodes on a portion of the interlayer dielectric layer, in which the electrodes are electrically connected to the first doping region and the second doping region through two of the holes.

A display panel is disclosed. The display panel has a display area and a non-display area, a plurality of pixels disposed in the display area, at least one driving circuit electrically connected to the pixels, and at least one photosensitive area having at least one photo detector electrically connected to the at least one driving circuit. The at least one photo detector has a substrate, a semiconductor layer disposed on the substrate, an insulating layer covered on the semiconductor layer, an interlayer dielectric layer covered on the insulating layer, and two electrodes formed on a portion of the interlayer dielectric layer. The semiconductor layer has a first doping region, a second doping region, and an intrinsic region located between the first doping region and the second doping region. The interlayer dielectric layer has at least three holes adapted to expose a portion of the insulating layer, a portion of the first doping region, and a portion of the second doping region. The two electrodes are electrically connected to the first doping region and the second doping region through two of the holes.

These and other objectives of the present invention will no doubt become obvious to those of ordinary skill in the art after reading the following detailed description of the preferred embodiment that is illustrated in the various figures and drawings.

DETAILED DESCRIPTION

After the formation of an insulating layer on a substrate, the present invention specifically forms a conductive layer on the insulating layer on top of the intrinsic region, such that the conductive layer can be utilized to block or to shield dopants (such as n-type, p-type, or combinations thereof) from injecting into the intrinsic region during the doping process. By using the conductive layer to block or to shield dopants such as phosphorus ions, the present invention could increase the photosensitivity of the photo detector significantly, thereby improving the overall performance of the photo detector.

Figure 1:
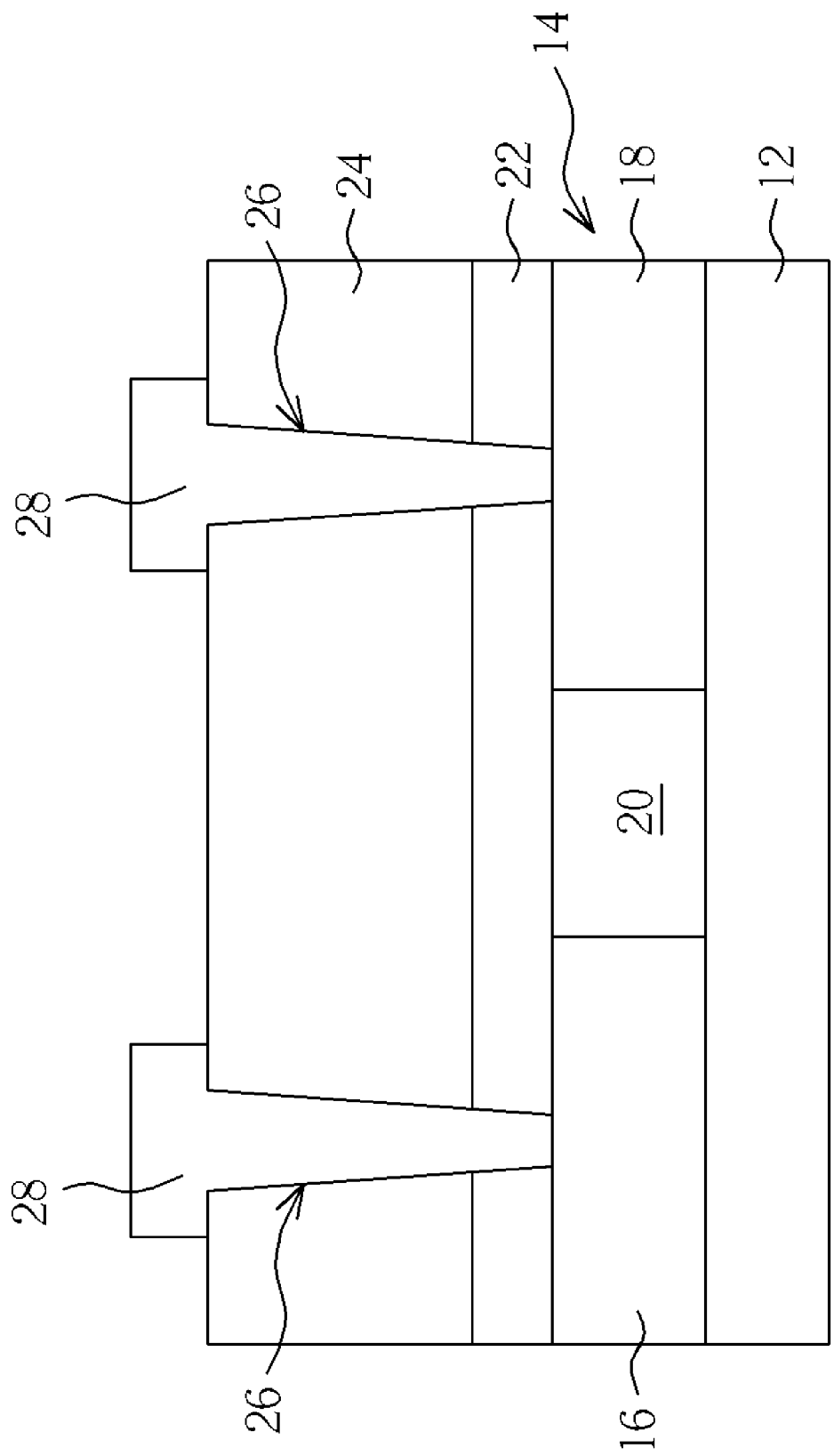
FIG. 1 illustrates a structural view of a photo detector composed of PIN diode according to the prior art.
Figure 2:
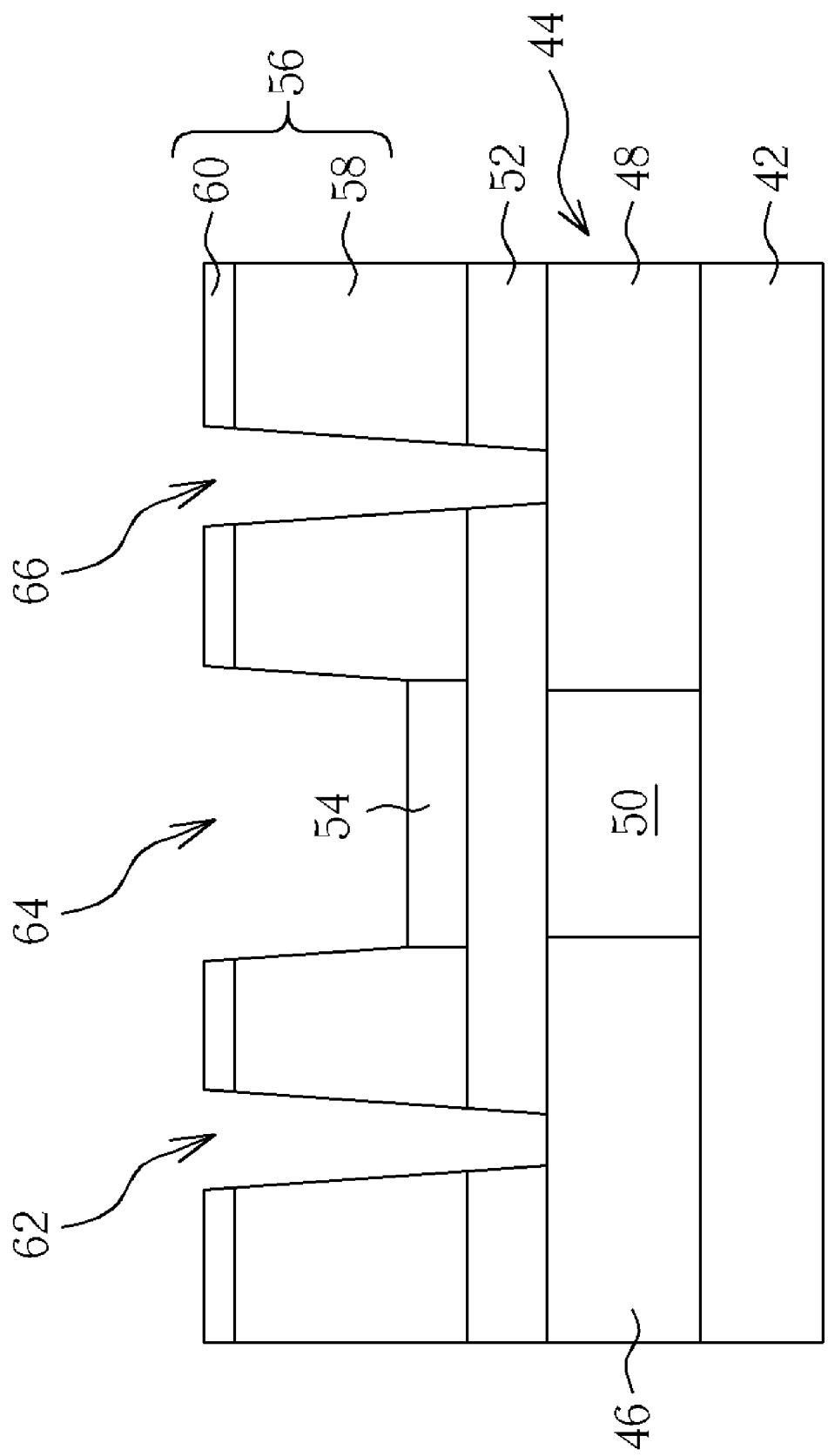
FIGS. 2-3 illustrate a method for fabricating a photo detector according to the first embodiment of the present invention.
Figure 3:
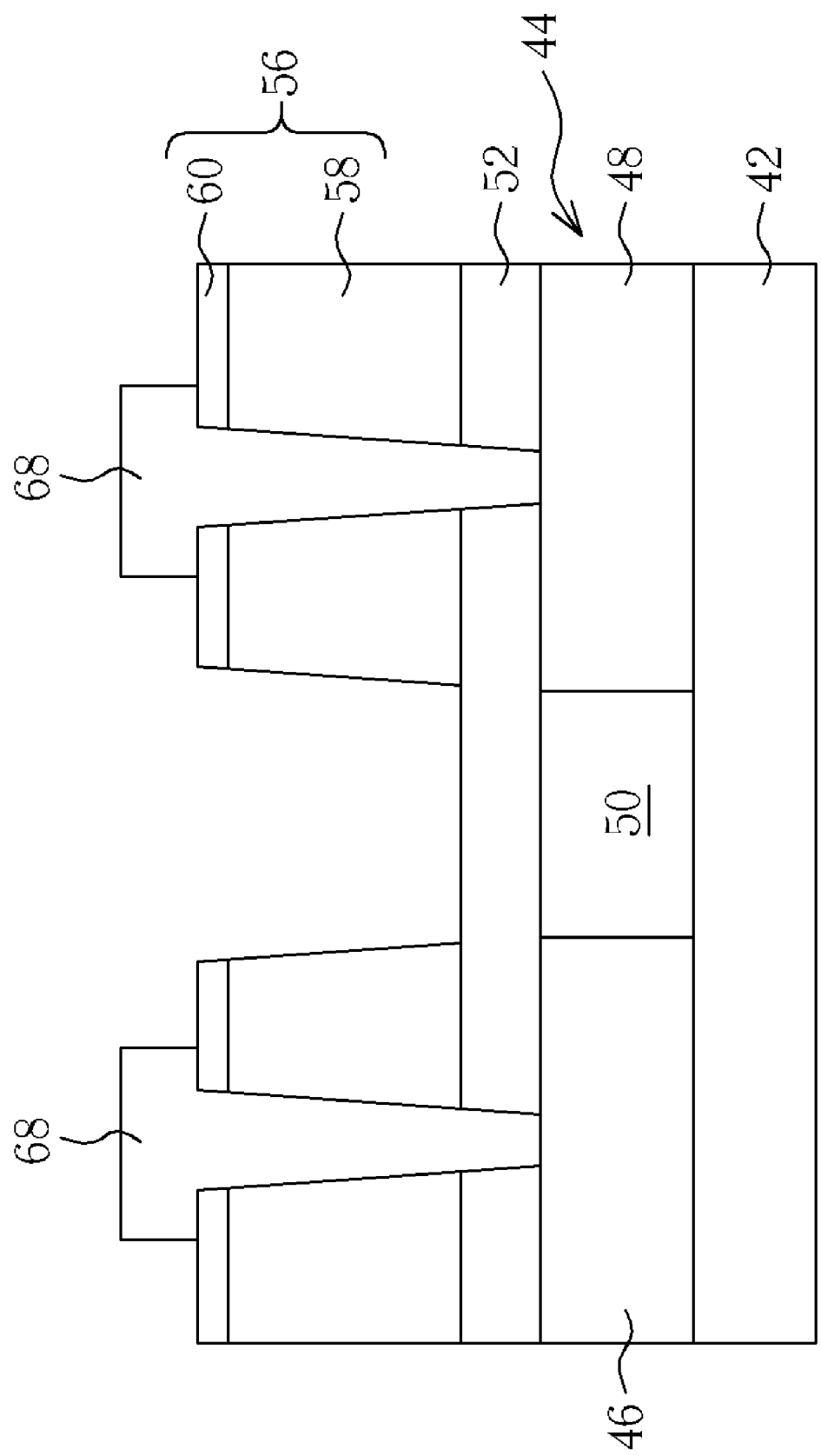

Referring to FIGS. 2-3, FIGS. 2-3 illustrate a method for fabricating a photo detector according to the first embodiment of the present invention. As shown in FIG. 2, a substrate 42 is first provided. The substrate 42 can be composed of transparent materials (including glass, quartz, other transparent materials, or combinations thereof), non-transparent materials (including ceramic, silicon dies, other non-transparent materials, or combinations thereof), or flexible materials (including polyolefines, polyamides, polyalcohols, polyesters, rubber, thermoplastic polymers, thermocuring polymers, polyaromatics, polymethyl methacrylates, polycarbonates, other flexible materials, or combinations thereof). The substrate of this embodiment of the present invention is composed of glass, but not limited thereto. A semiconductor layer 44 is then formed on the substrate 42, in which the semiconductor layer 44 can be composed of single crystal material containing silicon, micro-crystalline material containing silicon, polycrystalline material containing silicon, amorphous material containing silicon, or combinations thereof. This embodiment specifically utilizes polycrystalline material containing silicon, but not limited thereto.

An insulating layer 52 is then covered on the semiconductor layer 44, and a conductive layer 54 is formed on a portion of the insulating layer 52 substantially corresponding to the predetermined area of the intrinsic region 50 formed afterwards. A doping process is conducted to form a first doping region 46, a second doping region 48, and an intrinsic region 50 located between the first doping region 46 and the second doping region 48. Since the intrinsic region 50 is positioned under the conductive layer 54, the present invention could prevent the dopants injected into the semiconductor layer 44 during the doping process from injecting into the intrinsic region 50. The first doping region 46 and the second doping region 48 can be formed simultaneously or sequentially, and the polarity of the first doping region 46 is substantially different from or substantially equal to the polarity of the second doping region 48. At least one of the first doping region 46 and the second doping region 48 is doped with n-type dopants, p-type dopants, or a combination thereof. Preferably, the polarity of the first doping region 46 is substantially different from the polarity of the second doping region 48, but not limited thereto.

An interlayer dielectric layer 56 is then deposited on the insulating layer 52. The interlayer dielectric layer 56 may have only one layer, two sub-layers, or three sub-layers. The interlayer dielectric layer 56 of the present embodiment includes a first sub-layer 58 and a second sub-layer 60, but not limited thereto. At least one of the first sub-layer 58 and the second sub-layer 60 is comprised of inorganic material, organic material, or a combination thereof.

Next, an etching process is conducted to form at least three holes 62, 64, 66 in the interlayer dielectric layer 56 and at least two holes (such as the holes 62 and 66) in the insulating layer 52. The holes 62, 64, 66 are formed to expose at least one portion of the conductive layer 54, at least one portion of the first doping region 46, and at least one portion of the second doping region 48. In the present embodiment, as shown in FIG. 2, the interlayer dielectric layer 56 has three holes 62, 64, 66, in which the holes 62, 66 expose the portion of the first doping region 46 and the portion of the second doping region 48 and the hole 64 exposes the portion of the conductive layer 54 disposed above the intrinsic region 50. Preferably, at least one of the insulating layer 52, the interlayer dielectric layer 56, and the first sub-layer 58 and the second sub-layer 60 of the interlayer dielectric layer 56 is comprised of inorganic materials (such as silicon dioxide derived from silane, silicon dioxide derived from tetraethoxysilane, oxynitride, similar material, or combinations thereof), organic material (such as photoresist, polyarylene ether, polyolefines, polyamides, polyalcohols, polyesters, benzocyclobutene, hydrogen silsesquioxane, methyl silesquioxane, silicon-oxygen-carbon-hydrogen compounds, other materials, or combinations thereof), or combinations thereof. The conductive layer 54 is comprised of transparent materials (such as indium tin oxides, aluminum zinc oxides, aluminum tin oxides, indium zinc oxides, cadmium tin oxides, other materials, or combinations thereof), reflective materials (such as gold, silver, copper, iron, tin, lead, cadmium, molybdenum, tungsten, neodymium, titanium, tantalum, hafnium, other materials, oxides thereof, nitrides thereof, oxynitrides thereof, alloys thereof, or combinations thereof), or combinations thereof. The insulating layer 52 is comprised of silicon oxides derived from tetraethoxysilane having a thickness of about 100 angstroms and the conductive layer 54 is comprised of molybdenum as an exemplification of the present invention, but not limited thereto.

As shown in FIG. 3, a metal layer (not shown) is formed on the interlayer dielectric layer 56 and within the holes 62, 64, 66, and an etching process is conducted to remove the metal layer within the hole 64, the conductive layer 54 disposed under the metal layer, and a portion of the metal layer disposed on the first doping region 46 and the second doping region 48 to form two electrodes 68 on the interlayer dielectric layer 56. The electrodes 68 are electrically connected to the first doping region 46 and the second doping region 48 through the holes 62, 66. In other words, the metal layer and the conductive layer within the hole 64 is removed completely to expose the insulating layer 52 above the intrinsic region 50, in which the width of the exposed insulating layer 52 is substantially equal to the width of the intrinsic region 50. Nevertheless, the width of the insulating layer 52 exposed by the hole 64 can also be substantially smaller than or substantially greater than the width of the intrinsic region 50.

Figure 4:
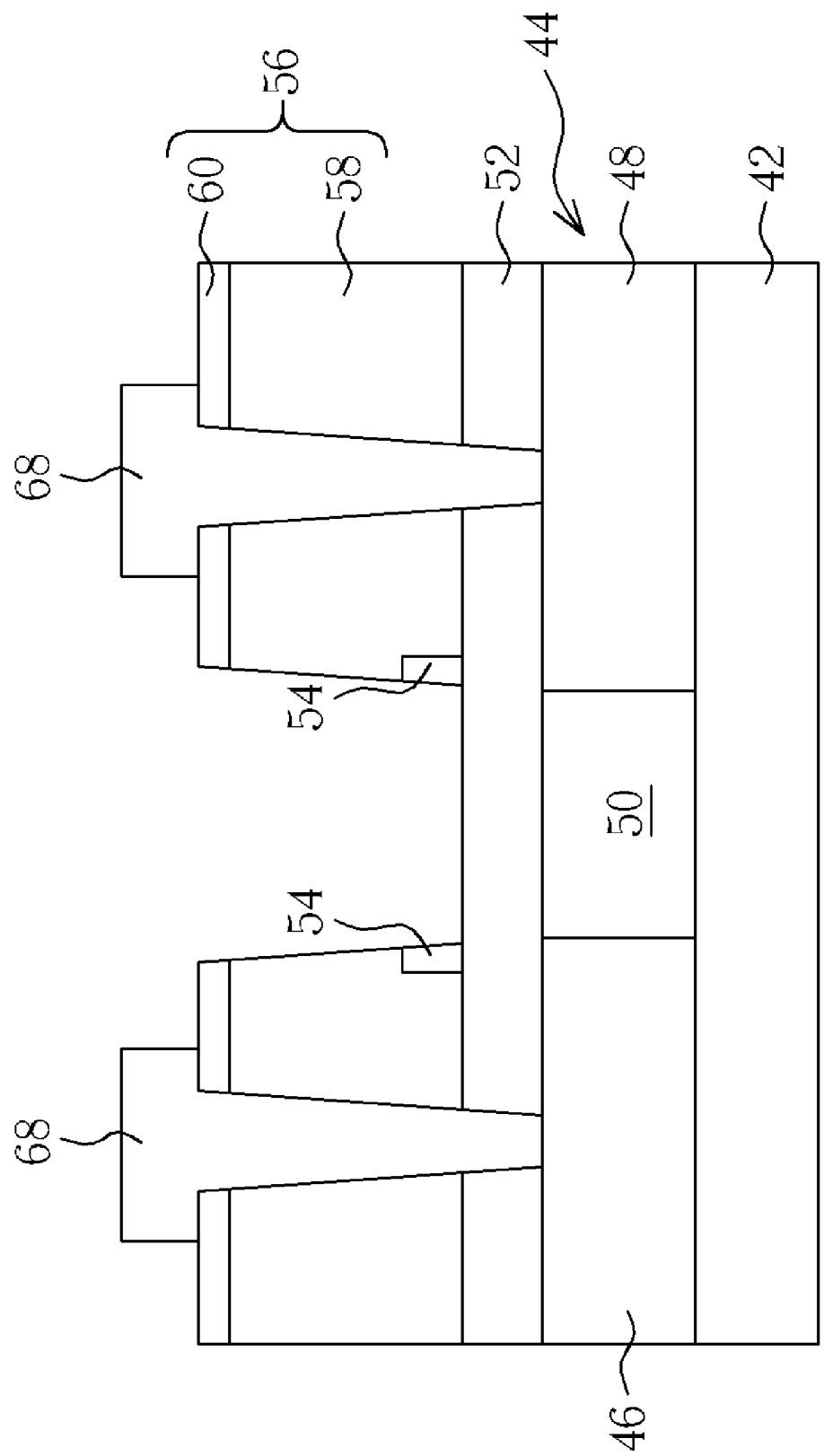
FIG. 4 illustrates a method for fabricating a photo detector according to the second embodiment of the present invention.

According to the second embodiment of the present invention, the etching process conducted to remove the conductive layer 54 could be adjusted to remove only a portion of the conductive layer 54, which is within the scope of the present invention. For instance, as shown in FIG. 4, while the etching process is conducted, the present invention could remove only a portion of the conductive layer 54, such that some of the conductive layer 54 is remained in the interlayer dielectric layer 56 above the first doping region 46 and the second doping region 48. In other words, the metal layer and the conductive layer disposed on the intrinsic region 50 with respect to the hole 64 is completely removed to expose the insulating layer 52 above the intrinsic region, in which the width of the exposed insulating layer 52 can be substantially smaller or substantially greater than the width of the intrinsic region 50. Moreover, if the interlayer dielectric layer 56 with two of the remained conductive layer 54, the ends of the remained conductive layers 54 is connected from each other and/or the ends of the remained conductive layer 54 is disconnected from each other.

Figure 5:
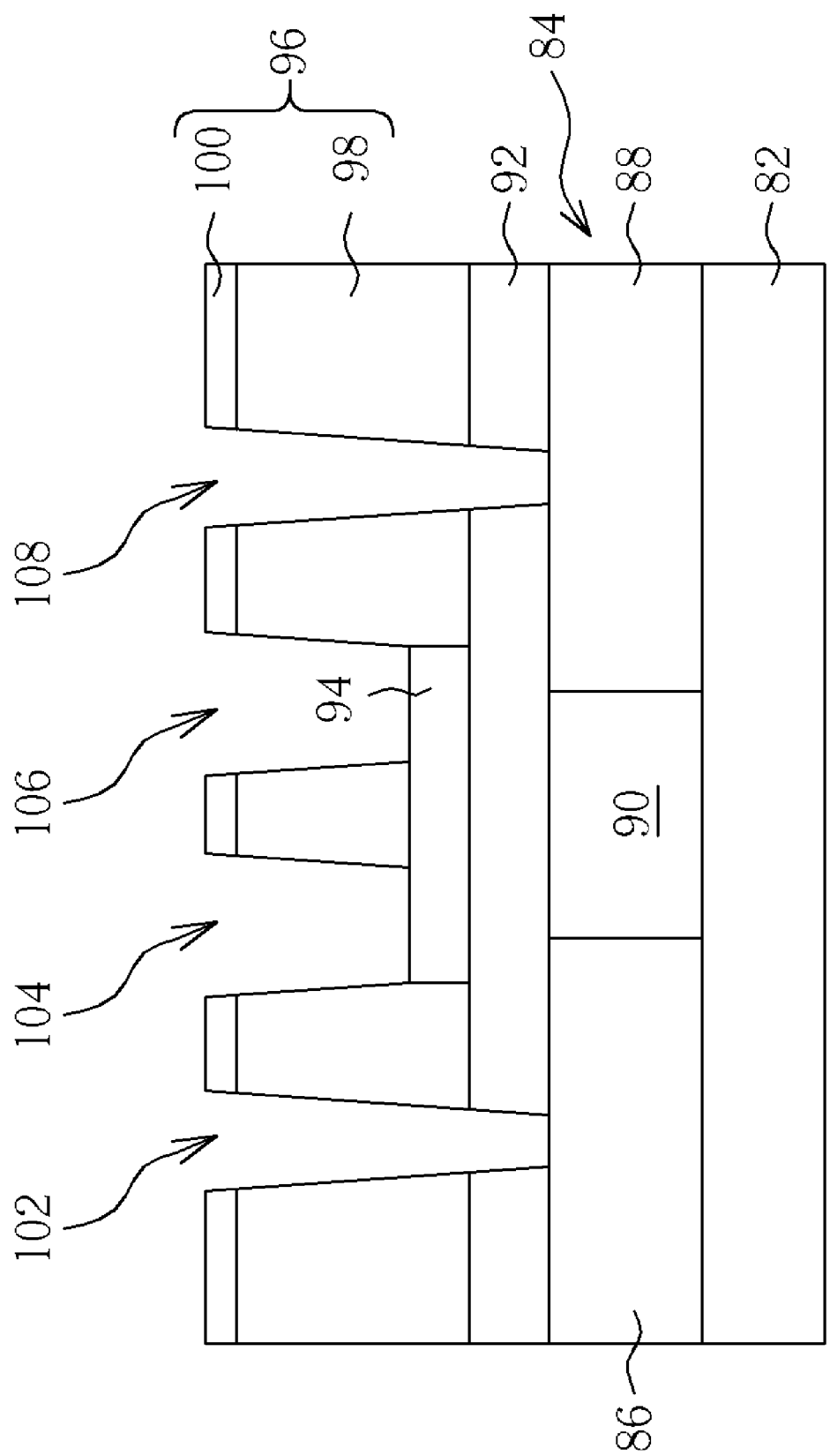
FIGS. 5-6 illustrate a method for fabricating a photo detector according to the third embodiment of the present invention.
Figure 6:
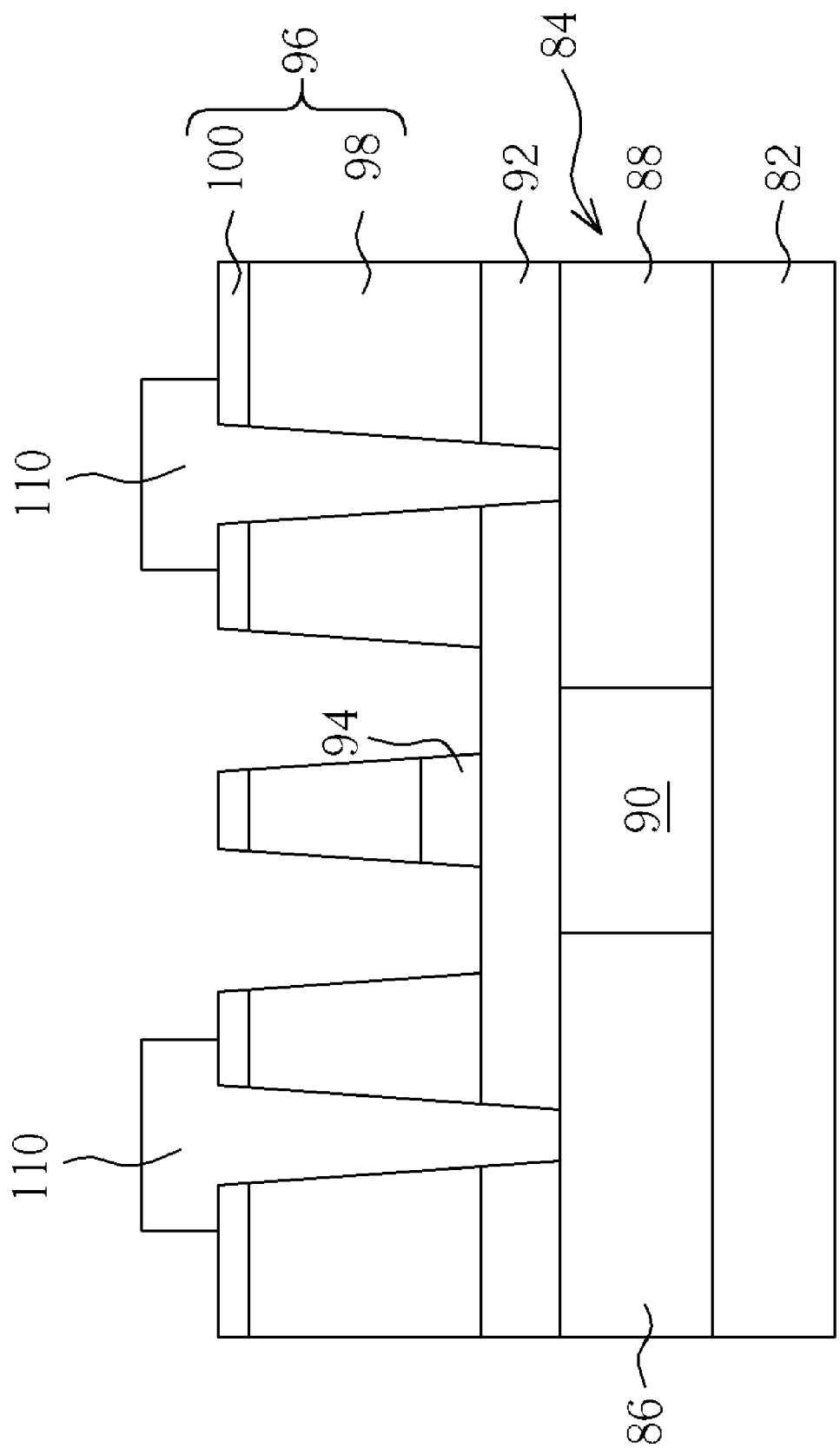

Referring to FIGS. 5-6, FIGS. 5-6 are perspective diagrams illustrating a method for fabricating a photo detector according to the third embodiment of the present invention. As shown in FIG. 5, a substrate 82 is first provided. The substrate 82 can be composed of transparent materials (including glass, quartz, other transparent materials, or combinations thereof), non-transparent materials (including ceramic, silicon dies, other non-transparent materials, or combinations thereof), or flexible materials (including polyolefines, polyamides, polyalcohols, polyesters, rubber, thermoplastic polymers, thermocuring polymers, polyaromatics, polymethyl methacrylates, polycarbonates, other flexible materials, or combinations thereof). The substrate of this embodiment of the present invention is composed of glass, but not limited thereto. A semiconductor layer 84 is then formed on the substrate 82, in which the semiconductor layer 84 can be composed of single crystal material containing silicon, micro-crystalline material containing silicon, polycrystalline material containing silicon, amorphous material containing silicon, or combinations thereof. Preferably, the semiconductor layer 84 of this embodiment is composed of polycrystalline material containing silicon, but not limited thereto.

An insulating layer 92 is then deposited on the semiconductor layer 84, and a conductive layer 94 is formed on a portion of the insulating layer 92 substantially corresponding to the predetermined area of the intrinsic region 90 formed afterwards. A doping process is conducted to form a first doping region 86, a second doping region 88, and an intrinsic region 90 located between the first doping region 86 and the second doping region 88. Since the intrinsic region 90 is formed under the conductive layer 94, the present invention could prevent the dopants injected into the semiconductor layer 84 during the doping process from entering the intrinsic region 90. The first doping region 86 and the second doping region 88 can be formed simultaneously or sequentially, and the polarity of the first doping region 86 is substantially different from or substantially equal to the polarity of the second doping region 88. At least one of the first doping region 86 and the second doping region 88 is doped with n-type dopants, p-type dopants, or a combination thereof. Preferably, the polarity of the first doping region 86 is substantially different from the polarity of the second doping region 88, but not limited thereto.

An interlayer dielectric layer 96 is then deposited on the insulating layer 92. The interlayer dielectric layer 96 may have only one layer, two sub-layers, or three sub-layers. The interlayer dielectric layer 96 of the present embodiment includes a first sub-layer 98 and a second sub-layer 100, but not limited thereto. At least one of the first sub-layer 98 and the second sub-layer 100 is comprised of inorganic material, organic material, or combinations thereof.

Next, an etching process is conducted to form a plurality of holes 102, 104, 106, 108 in the interlayer dielectric layer 96, in which at least two of the holes (such as holes 102 and 108) are further formed in the insulating layer 92. The holes 102, 104, 106, 108 are formed to expose a portion of the conductive layer 94, a portion of the first doping region 86, and a portion of the second doping region 88. In the present embodiment, as shown in FIG. 5, the interlayer dielectric layer 96 has four holes 102, 104, 106, 108, in which the holes 102 and 108 expose the portion of the first doping region 86 and the portion of the second doping region 88 respectively and the holes 104 and 106 expose a portion of the conductive layer 94 disposed above the intrinsic region 90. Preferably, at least one of the insulating layer 92, the interlayer dielectric layer 96, and the first sub-layer 98 and the second sub-layer 100 of the interlayer dielectric layer 96 is comprised of inorganic materials (such as silicon dioxide derived from silane, silicon dioxide derived from tetraethoxysilane, oxynitrides, similar material, or combinations thereof), organic materials (such as photoresist, polyarylene ether, polyolefines, polyamides, polyalcohols, polyesters, benzocyclobutene, hydrogen silsesquioxane, methyl silesquioxane, silicon-oxygen-carbon-hydrogen compounds, other materials, combinations thereof), or combinations thereof. The conductive layer 94 is comprised of transparent materials (such as indium tin oxides, aluminum zinc oxides, aluminum tin oxides, indium zinc oxides, cadmium tin oxides, other materials, or combinations thereof), reflective materials (such as gold, silver, copper, iron, tin, lead, cadmium, molybdenum, tungsten, neodymium, titanium, tantalum, hafnium, other materials, oxides thereof, nitrides thereof, oxynitrides thereof, alloys thereof, or combinations thereof), or combinations thereof. Preferably, the insulating layer 92 is comprised of silicon oxides derived from tetraethoxysilane having a thickness of about 100 angstroms and the conductive layer 94 is comprised of molybdenum as an exemplification of the present invention, but not limited thereto.

As shown in FIG. 6, a metal layer (not shown) is formed on the interlayer dielectric layer 96 and within the holes 102, 104, 106, 108, and an etching process is conducted to remove the metal layer within the holes 104 and 106, the conductive layer 94 disposed under the metal layer, and a portion of the metal layer disposed on the first doping region 86 and the second doping region 88 to form two electrodes 110 on the interlayer dielectric layer 96. The electrodes 110 are electrically connected to the first doping region 86 and the second doping region 88 through the holes 102 and 108. In other words, the metal layer and the conductive layer within the holes 104 and 106 are removed completely to expose the insulating layer 92 above the intrinsic region 90, the boundary region between the intrinsic region 90 and the first doping region 86, and the boundary region between the intrinsic region 90 and the second doping region 88.

Figure 7:
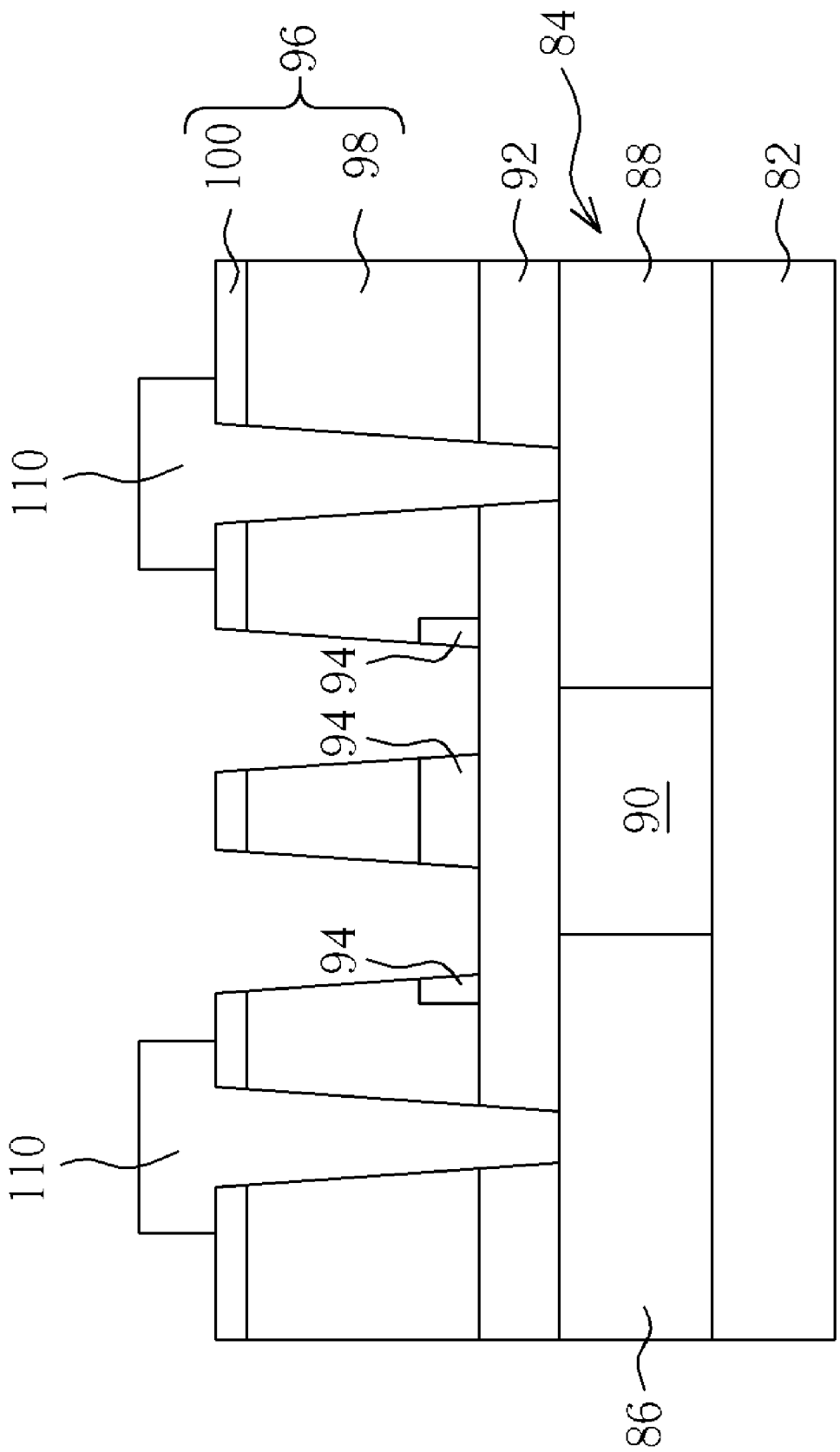
FIG. 7 illustrates a method for fabricating a photo detector according to the fourth embodiment of the present invention.

According to the fourth embodiment of the present invention, the present invention could also partially remove a portion of the conductive layer 94. As shown in FIG. 7, after the etching process is performed to remove the conductive layer 94, only a portion of the conductive layer 94 is removed while the rest of the conductive layer 94 is remained or inlayed in the interlayer dielectric layer 96 above the intrinsic region 90, the first doping region 86, and the second doping region 88. Moreover, at least one of the ends of the remained conductive layers 94 are connected from at least one other of the ends of the remained conductive layers 94 and/or at least one of the ends of the remained conductive layers 94 are disconnected from at least one of other of the ends of the remained conductive layers 94.

It should be noted that the photo detector disclosed in the aforementioned embodiments can be fabricated with or without a standard TFT-LCD fabrication process. Additionally, the structure and the fabrication of the photo detector of the present invention could be further applied to flat panel displays or semiconductor processes in the related fields, and the position of the photo detector can be adjusted according to the design of the product. The doping process disclosed in the previous four embodiments is preferably conducted after the formation of the conductive layer 54 and 94. Alternatively, the doping process could also be conducted after the formation of the semiconductor layer 44 and 84 or after the formation of the insulating layers 52 and 92, such that the first doping regions 46, 86, the second doping regions 48, 88, and the intrinsic regions 50, 90 could be formed simultaneously or one after another.

Figure 8:
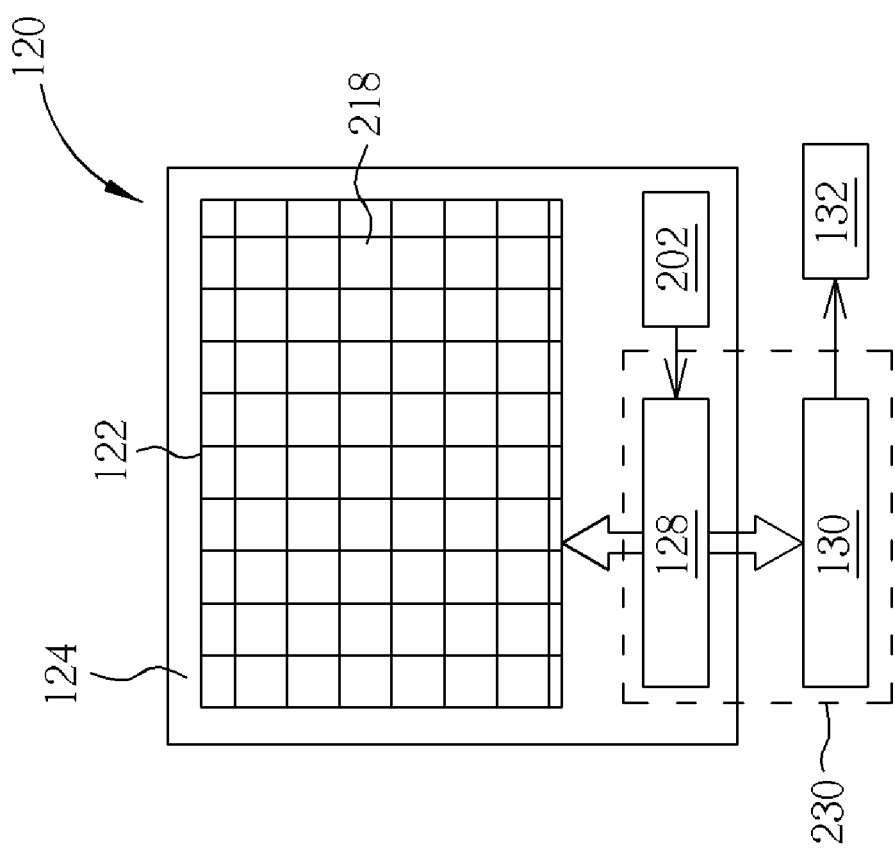
FIG. 8 illustrates a view of applying a photo detector on a display panel according to the fifth embodiment of the present invention.
Figure 9:
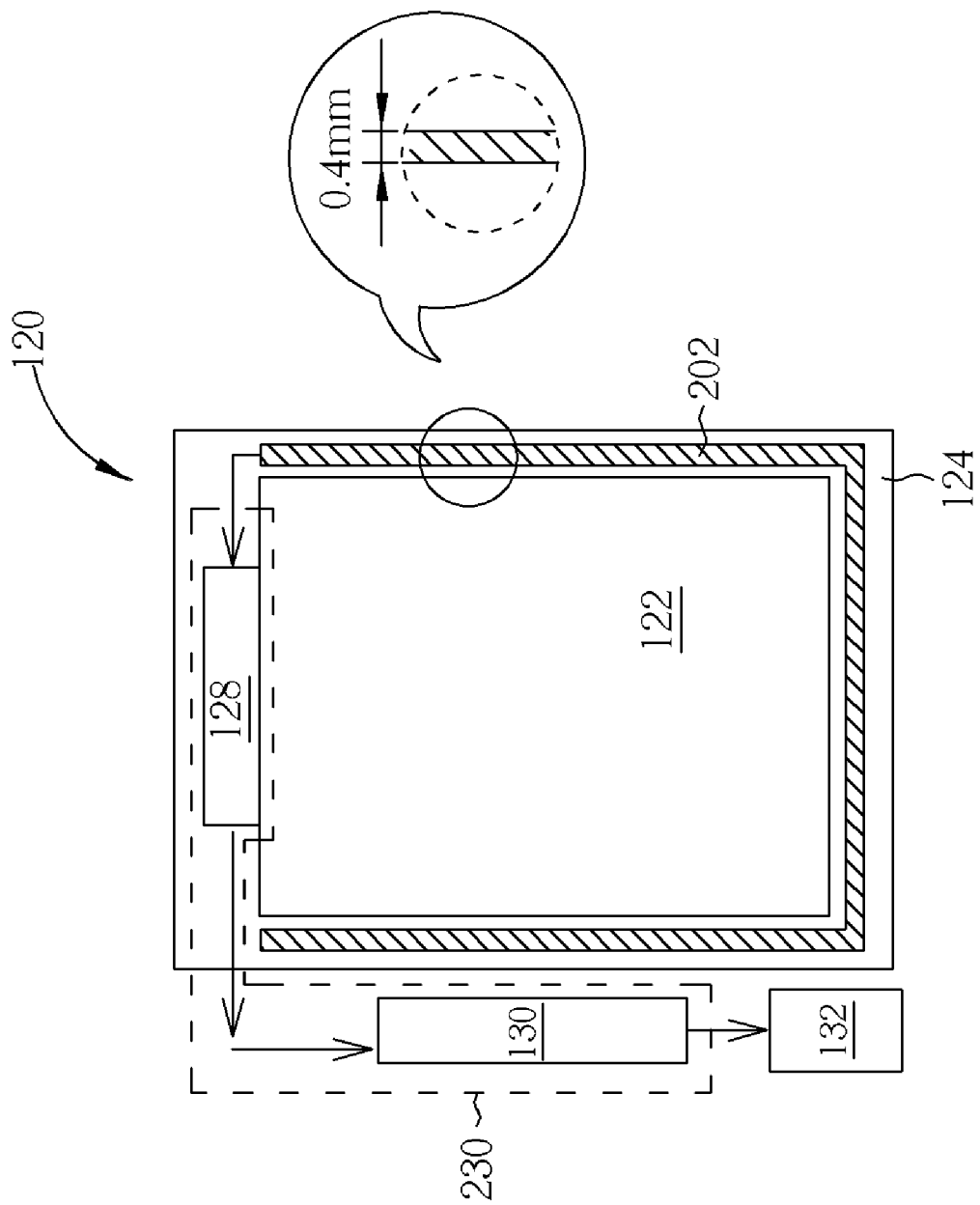
FIG. 9 illustrates a view of applying a photo detector on a display panel according to the sixth embodiment of the present invention.

Referring to FIGS. 8-9, FIGS. 8-9 illustrate a view of applying a photo detector onto a display panel according to the fifth and sixth embodiment of the present invention. Preferably, the photo detector of the present invention can be applied to either one or both the display area and non-display area of the display panel 120. Referring to FIG. 8, FIG. 8 illustrates a view of disposing a photo detector on the non-display area of a display panel 120. As shown in FIG. 8, the display panel of the present invention has a display area 122 and a non-display area 124, a plurality of pixels 218 disposed within the display area 122 and adapted to show the image and color of the display panel, and at least one photosensitive area 202 disposed in the non-display area 124. In the present embodiment, the photosensitive area 202 (which can be more than one) is positioned adjacent to at least one corner of the display panel 120, but no limited thereto. In other words, the photosensitive area 202 can be positioned in at least one corner of the non-display area 124, near the center of the display and within the non-display area 124, near the corner of the display and within the non-display area 124, other location within the non-display area 124, or combinations thereof. The photosensitive area 202 having at least one of the aforementioned photo detector (not shown) of the present invention is electrically connected to at least one driving circuit 230, which is further electrically connected to the pixels 218. Preferably, the photosensitive area 202 can be utilized as an ambient light sensing region, in which the lights may include at least one of the visible lights and invisible lights (such as ultraviolet lights, infrared lights, or lights of other wavelengths). Hence, the signal transmitted by the photo detector within the photosensitive area 202 could assist the display panel to achieve a much better image. The driving circuit 230 could also include a signal driving circuit 128, a light source driving circuit 130, a power supply circuit, a signal processing circuit, circuits of other functions, or any two combinations thereof. The display panel 120 also has a light source 132, which may be a point light source (such as an inorganic light emitting diode, an organic light emitting diode, or combinations thereof), a fluorescent lamp (such as a cold cathode fluorescent lamp, a hot cathode fluorescent lamp, an external electrode fluorescent lamp, a flat florescent lamp, other fluorescent lamps, or combinations thereof), or a surface emitting light source (such as a carbon nano tube light source, a plasma light source, other light sources, or combinations thereof). The aforementioned light sources can be applied to a direct type backlight or a side emitting backlight. For instance, if the driving circuit 230 were applied to a liquid crystal display panel, the driving circuit 230 would include the signal driving circuit 128 and the light source driving circuit 130 to drive a plurality of pixels 218 and the light source 132 respectively. If the driving circuit 230 were applied to an organic electroluminescent display, the driving circuit 230 would at least include the driving circuit 128 and the power supply circuit (not shown) for driving and providing the signals and power needed by the pixels 218. In this case, no light source would be needed. A circuit board (not shown) with/without at least one IC chip (not shown) can be further disposed on the non-display area 124 of the display panel 120 to electrically connect other external control devices. The circuit board can be a printed circuit board, a flexible printed circuit board, or combinations thereof.

Preferably, the photosensitive area 202 is formed on at least one side of the non-display area 214 of the display panel. According to the sixth embodiment of the present invention, as shown in FIG. 9, the photosensitive area 202 is formed on three sides of the non-display area 214, but not limited thereto. Additionally, the width from one side of the photosensitive area 202 substantially adjacent to the side of the display area 122 to another side of the photosensitive area (such as to the edge of the non-display area 124) is substantially less than or substantially equal to 0.4 mm. However, this width could be further adjusted according to the design of the product, such as adjusted for fabricating a display panel with narrower frame or larger display area.

Figure 10:
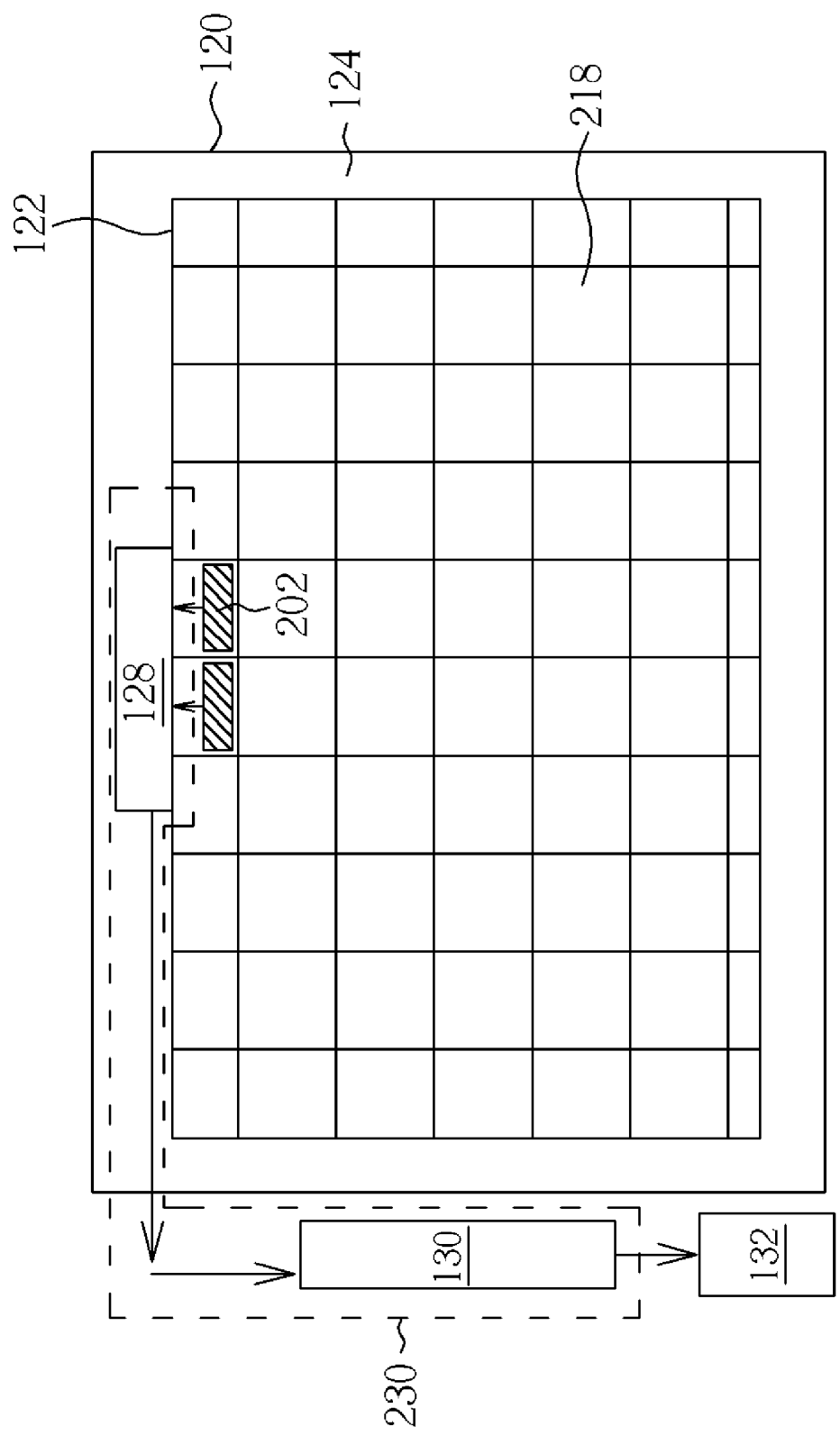
FIG. 10 illustrates a view of disposing a photo detector on the display area of a display panel according to the seventh embodiment of the present invention.

By following the process disclosed in the previous embodiments for fabricating the photo detector 126, the photosensitive area 202 can be formed only within the non-display area 124, only within the display area 122, or within both the non-display area 124 and the display area 122. While the photosensitive area 202 is formed within the non-display area 124, it can be formed in at least one corner substantially near the display panel 120, substantially surrounding the display area 122, or in other locations. For instance, as shown in FIG. 9, while the photosensitive area 202 is formed in the non-display area 124, it is essentially formed to substantially surround the display area 122. Additionally, according to the seventh embodiment of the present invention, as shown in FIG. 10, the photosensitive area 202 is formed in a portion of the pixels 218 within the display area 122 of the display panel 120. Nevertheless, the photosensitive area 202 could also be formed within every pixel 218 of the display area 122, which is within the scope of the present invention.

Preferably, in addition to using the photo detector (not shown) disposed in the photosensitive area 202 to detect light variation in the ambient environment, a sensing circuit (not shown) can be added to transmit signals to the driving circuit 230 disclosed in the aforementioned embodiment. This sensing circuit can be utilized to adjust the color detail and brightness sensitivity of the pixels 218 disposed in the display area 122, thereby improving and optimizing the image quality of the display panel 120.

Figure 11:
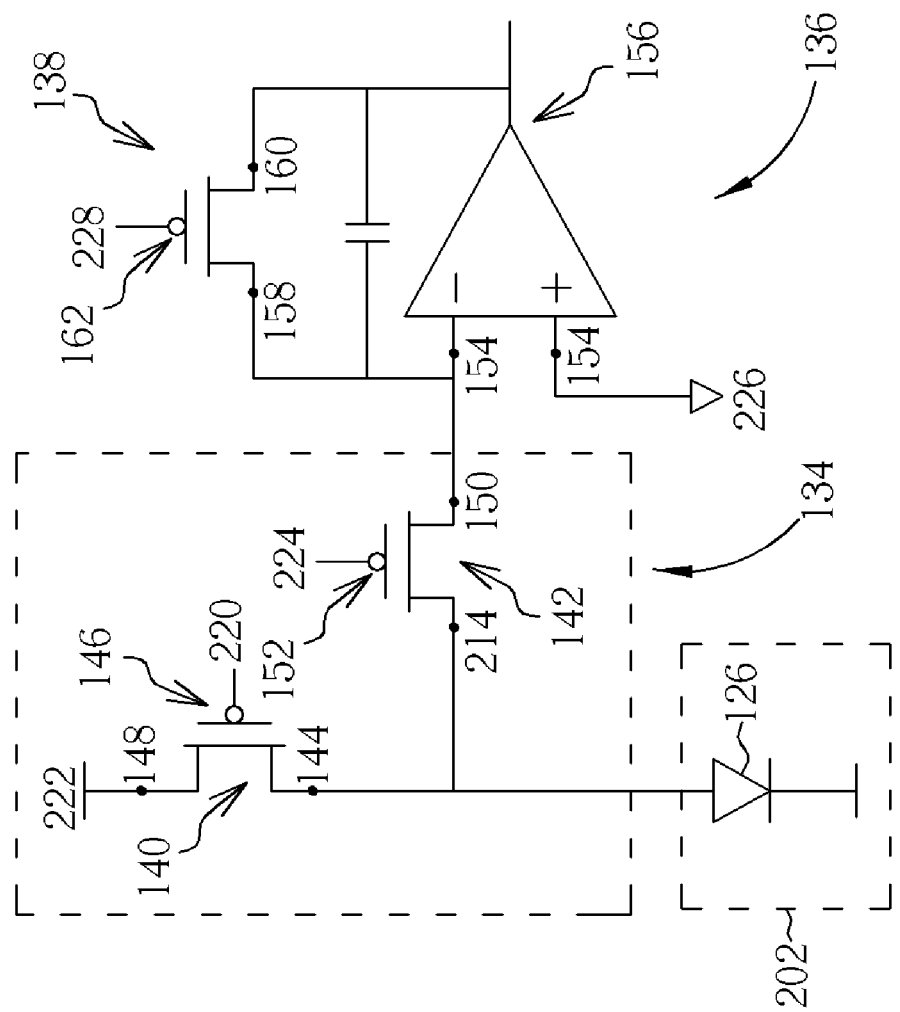
FIG. 11 illustrates a circuit diagram while disposing a photo detector on the non-display area of a display panel according to the fifth embodiment of the present invention.

Referring to FIG. 11, FIG. 11 illustrates a circuit diagram of electrically connecting a photosensitive area 202 of a photo detector to at least one sensing circuit 134. As shown in FIG. 11, the sensing circuit 134 is electrically connected to one of the two electrodes of the photo detector 126. The sensing circuit 134 has a first signal source 220, a second signal source 224, and a first voltage source 222. Preferably, the signal of the first signal source 220 is substantially different from the signal of the second signal source 224, but not limited thereto. The other electrode of the photo detector 126 is selectively connected to another voltage source (not shown), in which this voltage source is substantially different from the first voltage source 222, but not limited thereto.

At least one amplifier 136 and at least one first transistor 138 can be utilized with the sensing circuit 134. The amplifier 136 has two inputs 154 electrically connected to one of the two electrodes of the photo detector 126 and a reference voltage 226, and another input 156 electrically connected to a driving circuit (not shown). The first transistor 138 has a source/drain 158/160 electrically connected to one of the two inputs 154 of the amplifier 136, another source/drain 158/160 electrically connected to the driving circuit (not shown), and a gate 162 connected to a reset signal source 228. In the present embodiment, at least one signal source from the reset signal source 228, the first signal source 220, and the second signal source 224 is substantially different from the other, but not limited thereto. Hence, the first signal source 220 can be substantially different from the second signal source 224, the reset signal source 228 can be substantially identical to the first signal source 220 or the second signal source 224, or all three signal sources are substantially different from each other, but not limited thereto.

The sensing circuit 134 of the present embodiment also includes a second transistor 140 and a third transistor 142. The second transistor 140 has a source/drain 148/144 electrically connected to one of the two electrodes of the photo detector 126, a gate 146 connected to the first signal source 220, and another source/drain 148/144 connected to the first voltage source 222. The third transistor 142 has a source/drain 214/150 connected to one of the two inputs 154 of the amplifier 136, another source/drain 214/150 connected to one of the two electrodes of the photo detector 126, and a gate 152 connected to the second signal source 224. The circuit diagram of the present embodiment is specifically applicable for a photosensitive area formed on the non-display area of a display panel, but not limited thereto. The transistors of the present embodiment are p-type transistors. Nevertheless, the transistors can also be n-type transistors, or a combination thereof. Additionally, the sensing circuit of the present embodiment is comprised of two transistors, but not limited thereto. The number of the transistors (one, two, three, four, and so on) can be adjusted according to factors including reliability, cost, and design area of the display panel.

Figure 12:
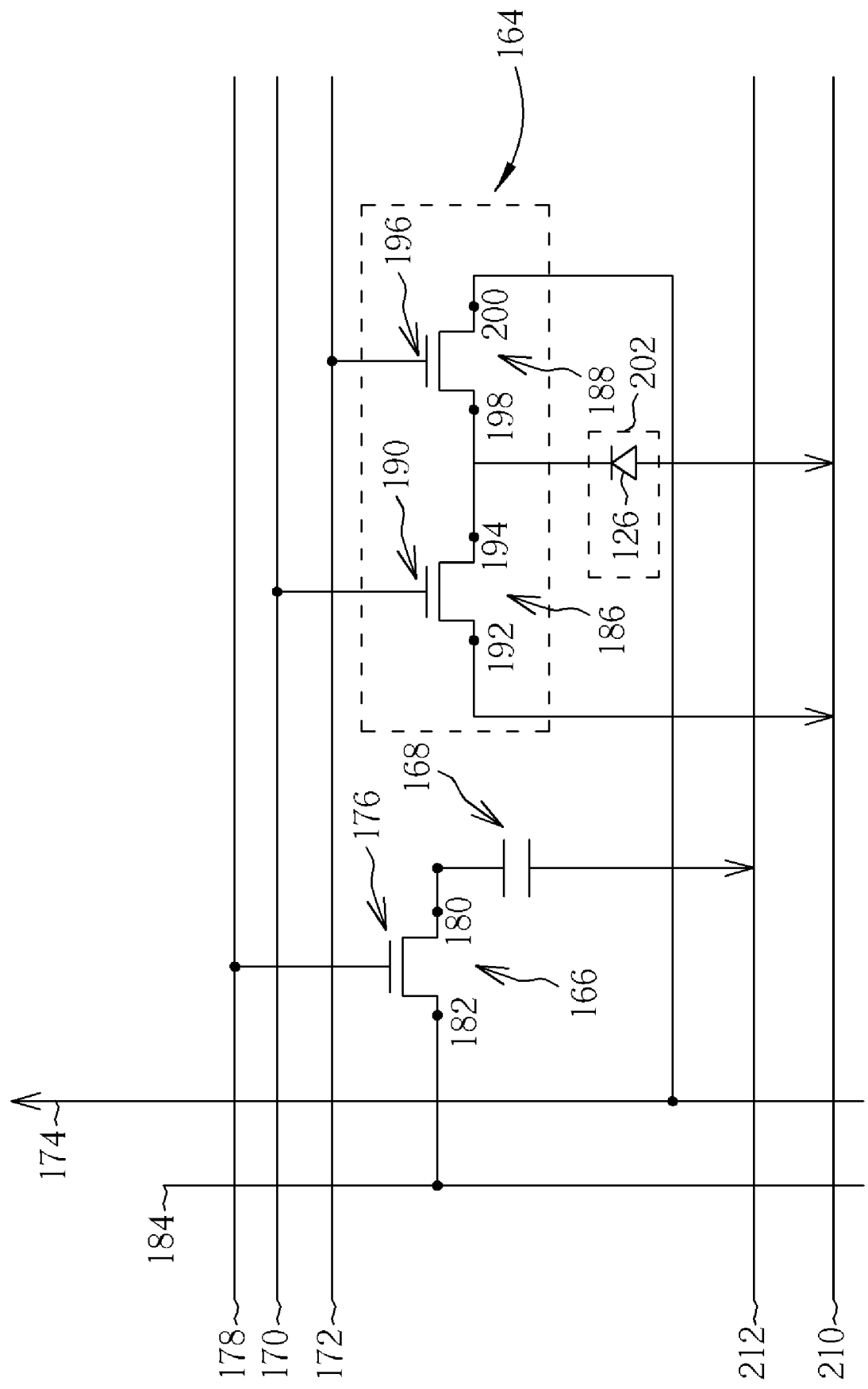
FIG. 12 illustrates a circuit diagram while disposing a photo detector on the display area of a display panel according to the seventh embodiment of the present invention.

Referring to FIG. 12, FIG. 12 illustrates a circuit diagram of electrically connecting the photosensitive area 202 and a sensing circuit 164 while the photo detector 126 is disposed in at least one portion of the pixels within the display area 122 of the display panel 120. As shown in FIG. 12, the sensing circuit 164 is disposed in at least a portion of the pixels or all of the pixels (not shown), in which the sensing circuit 164 is connected to at least one of the two electrodes of the photo detector 126 within the photosensitive area 202. The sensing circuit 164 is electrically connected to a first select line 170, a second select line 172, a first voltage source 210, and at least an amplifier 174. The sensing circuit 164 can be selectively connected to one of the first select line 170 and the second select line 172, a first voltage source 210, at least an amplifier 174, or three or more select lines.

Preferably, the pixels (not shown) within the display area (not shown) include at least one first transistor 166 and at least one capacitor 168. The number of the transistor and the capacitor could be adjusted according to the design of the product. Hence, two or more transistors and/or two or more capacitors could also be used selectively. The first transistor 166 has a gate 176 connected to at least a scan line 178 and a source/drain 182/180 connected to a data line 184. A capacitor 168 electrically connected to the first transistor 166 could be selectively connected to at least one of the common electrode lines 212 and a portion of the scan line 168. Furthermore, if the sensing circuit 164 is electrically connected to one of the first select line 170 and the second select line 172, such as to only one of the select lines, this select line would be used as a scan line or extended from the scan line to increase the aperture ratio for the display panel. Additionally, if the sensing circuit 164 is electrically connected to the first select line 170 and the second select line 172, either the first select line 170 or the second select line 172 is used as a scan line to increase the aperture ratio.

The sensing circuit 164, for example, also includes a second transistor 186 and a third transistor 188. The second transistor 186 has a gate 190 connected to the first select line 170, a source/drain 192/194 connected to one of two electrodes of the photo detector 126 within the photosensitive area 202, and another source/drain 192/194 connected to the first voltage source 210. The third transistor 188 has a gate 196 connected to the second select line 172, a source/drain 198/200 connected to one of the two electrodes of the photo detector 126 within the photosensitive area 202, and another source/drain 198/200 connected to the amplifier 174. The sensing circuit of the present embodiment is comprised of two transistors, but not limited thereto. Hence, the present invention could adjust the number of transistors (such one, two, three, four, and so on) according to the design of the product, including reliability, cost, and design area. For instance, the present invention could electrically connect a transistor to a select line, or connect three or more transistors to at least two select lines, which are all within the scope of the present invention. Preferably, the transistor would have a gate connected to the select line, a source/drain connected to one of the two electrodes of the photo detector, and another source/drain connected to the amplifier 174. The transistors disclosed in the present embodiment are n-type transistors. Nevertheless, the transistors can also be p-type transistors, or a combination thereof.

Figure 13:
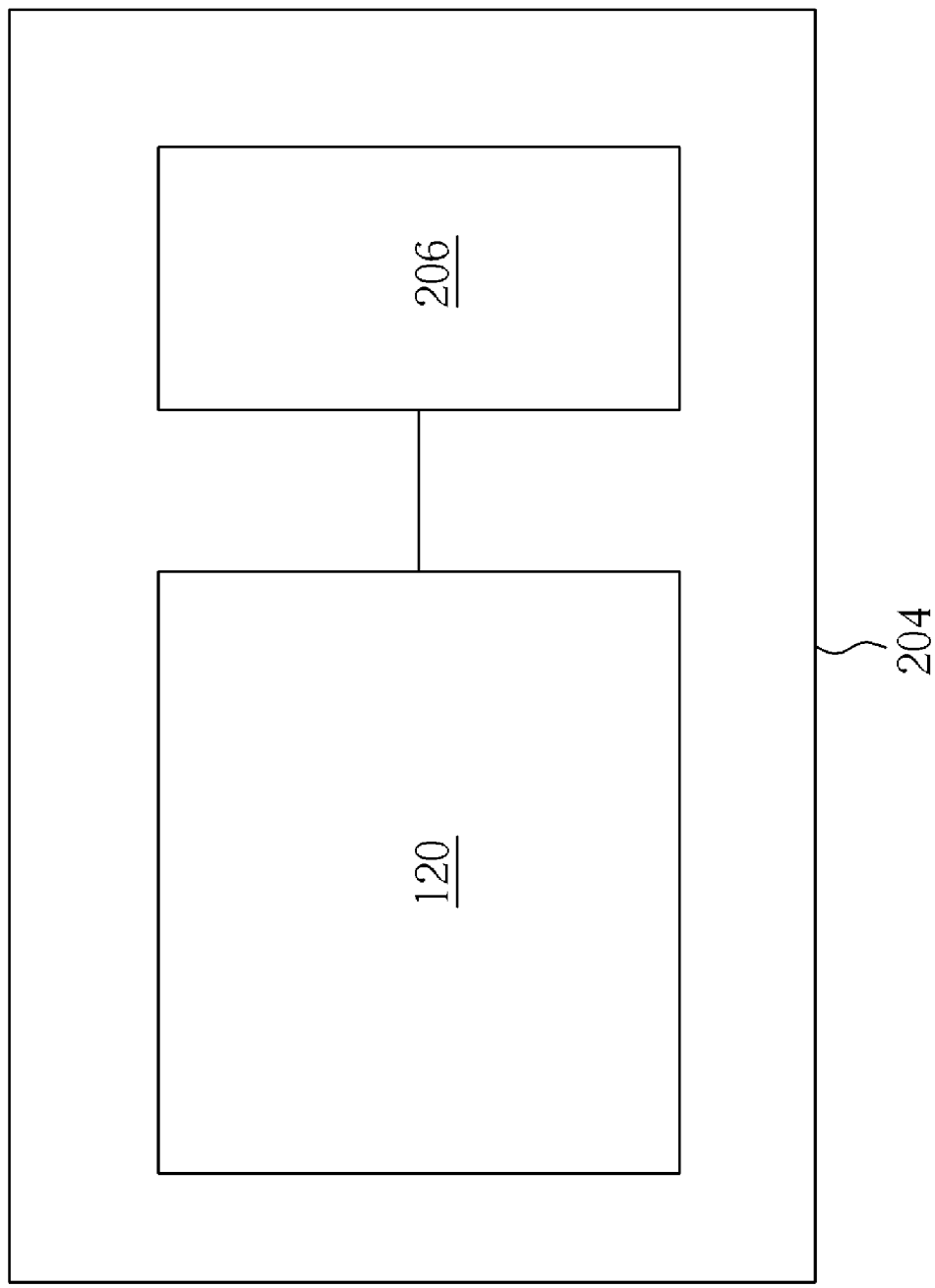
FIG. 13 illustrates a view of a photoelectric device according to the eighth embodiment of the present invention.

As shown in FIG. 13, the photo detector 126 within the photosensitive area could be applied to other photoelectric devices having functions other than the display panel disclosed in the aforementioned embodiments, such as solar cells, charge coupled devices, devices having touch functions, other devices, or any two combinations thereof. Preferably, the photoelectric device 204 could include a display panel 120 and an electronic device 206 connected to the display panel 120. The display panel could be sub-categorized according to the nature of the dielectric material disposed between the two substrates, including liquid crystal display panels, organic electroluminescent display panels, or combinations thereof. The display panel could be applied to portable products such as cellular phones, video recorders, notebook computers, game machines, watches, music players, email receivers, electronic photo frames, global positioning system, or similar products, audio and video products such as video players or similar products, monitors, televisions, indoor and/or outdoor billboards, guiding devices, and display panel of projectors.

Those skilled in the art will readily observe that numerous modifications and alterations of the device and method may be made while retaining the teachings of the invention.

What is claimed is:
1. A photo detector, comprising:
a substrate;
a semiconductor layer disposed on the substrate, wherein the semiconductor layer comprises a first doping region, a second doping region, and an intrinsic region located between the first doping region and the second doping region;
an insulating layer covered on the semiconductor layer;
an interlayer dielectric layer covered on the insulating layer, wherein the interlayer dielectric layer comprises at least three holes exposing a portion of the insulating layer, a portion of the first doping region and a portion of the second doping region, and the width of the portion of the insulating layer exposed by one of the holes is substantially greater than or substantially equal to the width of the intrinsic region; and two electrodes formed on a portion of the interlayer dielectric layer and electrically connected to the first doping region and the second doping region through two of the holes.

2. The photo detector of claim 1, wherein the portion of the insulating layer exposed by one of the holes of the interlayer dielectric layer is aligned with at least one of the intrinsic region, the boundary region between the intrinsic region and the first doping region, and the boundary region between the intrinsic region and the second doping region.

3. The photo detector of claim 1, wherein the portion of the insulating layer exposed by one of the holes of the interlayer dielectric layer is aligned with at least one of the boundary region between the intrinsic region and the first doping region and the boundary region between the intrinsic region and the second doping region.

4. The photo detector of claim 3, further comprising a conductive layer disposed on the insulating layer and aligned with the intrinsic region.

5. The photo detector of claim 1, wherein the interlayer dielectric layer comprises a first sub-layer and a second sub-layer.

6. The photo detector of claim 5, wherein the first sub-layer and the second sub-layer comprise inorganic material, organic material, or combinations thereof.

7. The photo detector of claim 1, wherein the insulating layer comprises inorganic material, organic material, or combinations thereof.

8. The photo detector of claim 4, wherein the conductive layer comprises transparent material, reflective material, or combinations thereof.

9. The photo detector of claim 1, wherein the polarity of the first doping region is substantially different from the polarity of the second doping region.

10. A method for fabricating a photo detector, comprising:
providing a substrate;
forming a semiconductor layer having a first doping region, a second doping region, and an intrinsic region located between the first doping region on the substrate;
covering an insulating layer on the semiconductor layer;
covering an interlayer dielectric layer on the insulating layer, wherein the interlayer dielectric layer comprises at least three holes exposing a portion of the insulating layer, a portion of the first doping region, and a portion of the second doping region, and the width of the portion of the insulating layer exposed by one of the holes is substantially greater than or substantially equal to the width of the intrinsic region; and
forming two electrodes on a portion of the interlayer dielectric layer is adapted to electrically connect the first doping region and the second doping region through two of the holes.

11. The method of claim 10, wherein the portion of the insulating layer exposed by one of the holes of the interlayer dielectric layer is aligned with at least one of the intrinsic region, the boundary region between the intrinsic region and the first doping region, and the boundary region between the intrinsic region and the second doping region.

12. The method of claim 10, wherein the portion of the insulating layer exposed by one of the holes of the interlayer dielectric layer is aligned with at least one of the boundary region between the intrinsic region and the first doping region and the boundary region between the intrinsic region and the second doping region.

13. The method of claim 12, further comprising a conductive layer disposed on the insulating layer and aligned with the intrinsic region.

14. The method of claim 10, wherein the interlayer dielectric layer comprises a first sub-layer and a second sub-layer.

15. The method of claim 14, wherein the first sub-layer and the second sub-layer comprise inorganic material, organic material, or combinations thereof.

16. The method of claim 10, wherein the insulating layer comprises inorganic material, organic material, or combinations thereof.

17. The method of claim 13, wherein the conductive layer comprises transparent material, reflective material, or combinations thereof.

18. The method of claim 10, wherein the polarity of the first doping region is substantially different from the polarity of the second doping region.

19. A photo detector, comprising:
a substrate;
a semiconductor layer disposed on the substrate, wherein the semiconductor layer comprises a first doping region, a second doping region, and an intrinsic region located between the first doping region and the second doping region;
an insulating layer covered on the semiconductor layer;
a conductive layer disposed on the insulating layer and aligned with the intrinsic region;
an interlayer dielectric layer covered on the insulating layer, wherein the interlayer dielectric layer comprises at least three holes exposing a portion of the insulating layer, a portion of the first doping region and a portion of the second doping region, and the portion of the insulating layer exposed by one of the holes of the interlayer dielectric layer is aligned with at least one of the boundary region between the intrinsic region and the first doping region and the boundary region between the intrinsic region and the second doping region; and
two electrodes formed on a portion of the interlayer dielectric layer and electrically connected to the first doping region and the second doping region through two of the holes.

20. The photo detector of claim 19, wherein the width of the portion of the insulating layer exposed by one of the holes is substantially greater than or substantially equal to the width of the intrinsic region.

21. The photo detector of claim 19, wherein the interlayer dielectric layer comprises a first sub-layer and a second sub-layer.

22. The photo detector of claim 21, wherein the first sub-layer and the second sub-layer comprise inorganic material, organic material, or combinations thereof.

23. The photo detector of claim 19, wherein the insulating layer comprises inorganic material, organic material, or combinations thereof.

24. The photo detector of claim 19, wherein the conductive layer comprises transparent material, reflective material, or combinations thereof.

25. The photo detector of claim 19, wherein the polarity of the first doping region is substantially different from the polarity of the second doping region.

26. A method for fabricating a photo detector, comprising:
providing a substrate;
forming a semiconductor layer having a first doping region, a second doping region, and an intrinsic region located between the first doping region on the substrate;
covering an insulating layer on the semiconductor layer;
disposing a conductive layer on the insulating layer and aligned with the intrinsic region;

covering an interlayer dielectric layer on the insulating layer, wherein the interlayer dielectric layer comprises at least three holes exposing a portion of the insulating layer, a portion of the first doping region, and a portion of the second doping region, and the portion of the insulating layer exposed by one of the holes of the interlayer dielectric layer is aligned with at least one of the boundary region between the intrinsic region and the first doping region and the boundary region between the intrinsic region and the second doping region; and forming two electrodes on a portion of the interlayer dielectric layer is adapted to electrically connect the first doping region and the second doping region through two of the holes.

27. The method of claim 26, wherein the width of the portion of the insulating layer exposed by one of the holes is substantially greater than or substantially equal to the width of the intrinsic region.

28. The method of claim 26, wherein the interlayer dielectric layer comprises a first sub-layer and a second sub-layer.

29. The method of claim 28, wherein the first sub-layer and the second sub-layer comprise inorganic material, organic material, or combinations thereof.

30. The method of claim 26, wherein the insulating layer comprises inorganic material, organic material, or combinations thereof.

31. The method of claim 26, wherein the conductive layer comprises transparent material, reflective material, or combinations thereof.

32. The method of claim 26, wherein the polarity of the first doping region is substantially different from the polarity of the second doping region.

* * * * *

UNITED STATES PATENT AND TRADEMARK OFFICE
CERTIFICATE OF CORRECTION

PATENT NO. : 7,595,541 B2  Page 1 of 1
APPLICATION NO. : 11/776559
DATED : September 29, 2009
INVENTOR(S) : Chien-Sen Weng et al.

It is certified that error appears in the above-identified patent and that said Letters Patent is hereby corrected as shown below:

On the title page, item (73), correct the name of the assignee from "AU Optrinics Corp." to "AU Optronics Corp."

Signed and Sealed this

Twenty-fourth Day of November, 2009

David J. Kappos
*Director of the United States Patent and Trademark Office*